United States Patent
Noh

(10) Patent No.: US 9,871,189 B2
(45) Date of Patent: Jan. 16, 2018

(54) ELECTRONIC DEVICE AND METHOD FOR FABRICATING THE SAME

(71) Applicant: SK hynix Inc., Icheon-Si (KR)

(72) Inventor: Seung-Mo Noh, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/073,430

(22) Filed: Mar. 17, 2016

(65) Prior Publication Data

US 2016/0308116 A1 Oct. 20, 2016

(30) Foreign Application Priority Data

Apr. 14, 2015 (KR) ........................ 10-2015-0052582

(51) Int. Cl.
| | |
|---|---|
| *H01L 43/02* | (2006.01) |
| *H01L 43/08* | (2006.01) |
| *G06F 3/06* | (2006.01) |
| *G06F 12/0802* | (2016.01) |

(52) U.S. Cl.
CPC ............ *H01L 43/02* (2013.01); *G06F 3/0604* (2013.01); *G06F 3/0629* (2013.01); *G06F 3/0656* (2013.01); *G06F 3/0679* (2013.01); *G06F 12/0802* (2013.01); *H01L 43/08* (2013.01); *G06F 2212/2024* (2013.01); *G06F 2212/60* (2013.01)

(58) Field of Classification Search
CPC ..................... H01L 43/02; H01L 43/08; G11C 11/14–11/16; G11C 11/161
See application file for complete search history.

(56) References Cited

U.S. PATENT DOCUMENTS

| | | | | |
|---|---|---|---|---|
| 2012/0292724 | A1* | 11/2012 | Lim | ........................ H01L 43/08 257/421 |
| 2014/0021426 | A1* | 1/2014 | Lee | ........................ H01L 43/02 257/1 |
| 2014/0242418 | A1* | 8/2014 | Shukh | ................... G11C 11/161 428/811.1 |

FOREIGN PATENT DOCUMENTS

KR    10-2007-0082558 A    8/2007

OTHER PUBLICATIONS

Miura, Y. et al., "A first-principles study on magnetocrystalline anisotropy at interfaces," Journal of Applied Physics, 113:233908, 2013.

(Continued)

*Primary Examiner* — Allison P Bernstein
(74) *Attorney, Agent, or Firm* — Perkins Coie LLP

(57) ABSTRACT

This technology provides an electronic device and a method for fabricating the same. An electronic device in accordance with an implementation of this document includes semiconductor memory, and the semiconductor memory includes a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer.

14 Claims, 7 Drawing Sheets

(56) References Cited

OTHER PUBLICATIONS

Yamane, H., "Concurrent improvement of magneto-optical and perpendicular magnetic properties in CoPt/Ag stacked structures with ZnO intermediate thin layers," Applied Physics Letters, 102:072412, 2013.

* cited by examiner ium ELECTRONIC DEVICE AND METHOD FOR
FABRICATING THE SAME

CROSS-REFERENCE TO RELATED
APPLICATION

This patent document claims priority of Korean Patent Application No. 10-2015-0052582, entitled "ELECTRONIC DEVICE AND METHOD FOR FABRICATING THE SAME" and filed on Apr. 14, 2015, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device includes semiconductor memory, and the semiconductor memory includes a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer.

Implementations of the above electronic device may include one or more the following.

The metal oxide layer has a thickness which allows a current flow and has an insulating characteristic or a semiconducting characteristic. The metal oxide layer has a thickness less than about 10 nm. The magnetic correction layer includes different elements that include Co or Fe in a combination with Pt, Pd, or Ni. The metal oxide layer includes ZnO. The MTJ structure, the magnetic correction layer and the under layer have sidewalls aligned with each other. The MTJ structure and the magnetic correction layer have sidewalls aligned with each other, and the under layer has a sidewall which is not aligned with the sidewalls of the MTJ structure and the magnetic correction layer. A width of a top surface of the under layer is larger than a width of a bottom surface of the magnetic correction layer. The free layer is located at an undermost portion of the MTJ structure, and the semiconductor memory further includes: a middle layer located between the free layer and the magnetic correction layer, and including a nonmagnetic metal layer. The free layer includes CoFeB. A metal included in the nonmagnetic metal layer is same as a metal included in the metal oxide layer. The nonmagnetic metal layer includes Zn, and the metal oxide layer includes ZnO.

In another aspect, an electronic device includes semiconductor memory, and the semiconductor memory includes a metal oxide under layer; a magnetic correction layer located over the metal oxide under layer; a nonmagnetic metal middle layer located over the magnetic correction layer; a free layer including CoFeB and located over the nonmagnetic metal middle layer; a tunnel barrier layer located over the free layer; and a pinned layer located over the tunnel barrier layer.

Implementations of the above electronic device may include one or more the following.

The magnetic correction layer includes Co or Fe in a combination with Pt, Pd, or Ni, and the metal oxide under layer includes ZnO. The nonmagnetic metal middle layer and the metal oxide under layer include a common metal. The nonmagnetic metal middle layer includes Zn, and the metal oxide under layer includes ZnO.

The electronic device may further include a microprocessor which includes a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device comprising a semiconductor memory includes forming an under layer including a metal oxide layer over a substrate; forming a magnetic correction layer over the under layer; and forming an MTJ (Magnetic Tunnel Junction) structure including a free layer having a variable magnetization direction, a pinned layer having a pinned magnetization direction, and a tunnel barrier layer interposed between the pinned layer and the free layer, wherein the magnetic correction layer is structured to reduce an influence of a stray magnetic field generated by the pinned layer at the free layer.

Implementations of the above method may include one or more the following.

The method further includes etching the MTJ structure, the magnetic correction layer and the under layer using a single mask after the forming of the MTJ structure. The method further includes, before the forming of the under layer, forming an interlayer dielectric layer over the substrate; forming a hole exposing a portion of the substrate by selectively etching the interlayer dielectric layer; and forming a conductive contact in a lower portion of the hole, and the forming of the under layer includes providing the under layer in a remaining portion of the hole except the lower portion of the hole. The method further includes forming a pattern by etching the MTJ structure and the magnetic correction layer using a single mask after the forming of the MTJ structure, wherein the pattern has a sidewall which is not aligned with a sidewall of the under layer. A width of a top surface of the under layer is larger than a width of a bottom surface of the pattern. The method further includes forming a middle layer located under the free layer and including a nonmagnetic metal layer, after the forming of the magnetic correction layer, and wherein the free layer is located at an undermost portion of the MTJ structure. The forming of the under layer includes forming a first metal layer using a first metal target, and the forming of the middle layer includes forming a second metal layer using a second metal target, where the first metal layer is same as the second metal layer and the first metal target is same as the second metal target. The forming of the under layer further includes oxidizing the first metal layer, after forming of the first metal layer.

These and other aspects, implementations and associated advantages are described in greater detail in the drawings, the description and the claims.

DETAILED DESCRIPTION

Figure 1:
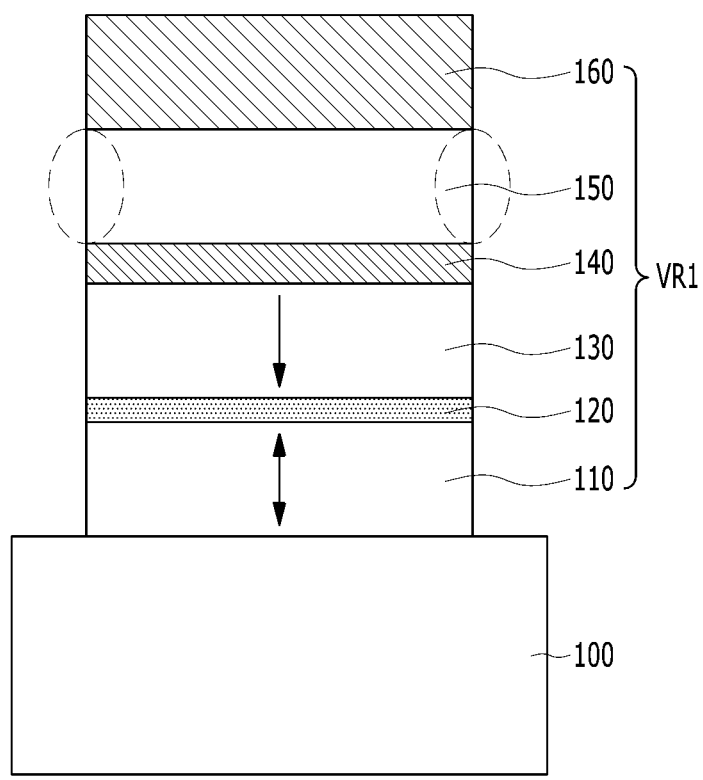
FIG. 1 is a cross-sectional view illustrating a variable resistance element in accordance with a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to explaining implementations, a variable resistance element of a comparative example will be described.

FIG. 1 is a cross-sectional view illustrating a variable resistance element in accordance with a comparative example. The method of fabricating the variable resistance element in accordance with the comparative example and its associated problem will be discussed together.

Referring to FIG. 1, a variable resistance element VR1 of a comparative example may include an MTJ (Magnetic Tunnel Junction) structure which is disposed over a substrate 100 and includes a free layer 110 having a variable magnetization direction, a tunnel barrier layer 120 disposed over the free layer 110 and allowing tunneling of electrons, and a pinned layer 130 disposed over the tunnel barrier layer 120 and having a pinned magnetization direction. The variable resistance element VR1 further includes a magnetic correction layer 150 disposed over the MTJ structure and reducing an influence of a stray magnetic field generated by the pinned layer 130 to reduce a bias magnetic field generated in the free layer 110, a metal buffer layer 140 interposed between the pinned layer 130 and the magnetic correction layer 150, and a capping layer 160 disposed over the magnetic correction layer 150 and serving as a hard mask during an etching process for forming the variable resistance element VR1.

The variable resistance element VR1 may be formed by sequentially depositing material layers that are for forming the free layer 110, the tunnel barrier layer 120, the pinned layer 130, the metal buffer layer 140, the magnetic correction layer 150 and the capping layer 160 over the substrate 100, and etching the material layers using an etching method having a strong physical etching characteristic, for example, an IBE (Ion Beam Etching) method. This is because it is difficult to etch a magnetic material included in the free layer 110, the pinned layer 130, the magnetic correction layer 150, etc.

However, when using the IBE method, an etching damage to the variable resistance element VR1 may occur. Specially, since the magnetic correction layer 150 located at a relatively upper portion is exposed to the etching process for a long time, a sidewall of the magnetic correction layer 150 may be highly damaged due to the etching process (see an area surrounded by a dotted line). As a result, the magnetic correction layer 150 cannot properly perform its operation of reducing a undesired influence of a stray magnetic field generated by the pinned layer 130 at the free layer 110. For example, such damages to the magnetic correction layer 150 may cause the layer 150 to generate a corrective magnetic field at the free layer 110 that is not able to offset the stray magnetic field of the pinned layer 130 to a sufficient degree.

In these implementations, an etching damage to a magnetic correction layer may be reduced by locating the magnetic correction layer under an MTJ structure. Also, a structure for improving a characteristic of a variable resistance element may be disclosed while a magnetic correction layer is located under an MTJ structure.

Figure 2:
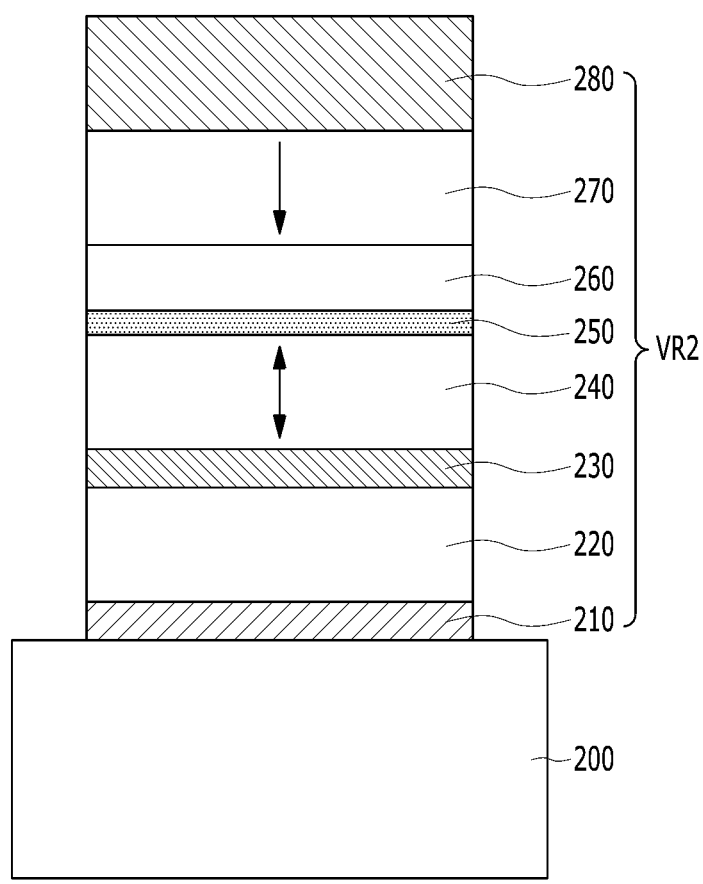
FIG. 2 is a cross-sectional view illustrating an exemplary variable resistance element in accordance with an implementation of the present disclosure.

FIG. 2 is a cross-sectional view illustrating an exemplary variable resistance element in accordance with an implementation of the present disclosure. The exemplary method of fabricating the variable resistance element will be discussed together.

Referring to FIG. 2, a variable resistance element VR2 in accordance with an implementation may include an under layer 210, a magnetic correction layer 220, a first middle layer 230, a free layer 240, a tunnel barrier layer 250, a second middle layer 260, a pinned layer 270 and a capping layer 280 which are sequentially stacked over a substrate 200.

Here, a structure including the free layer 240, the pinned layer 270 and the tunnel barrier layer 250 interposed therebetween may be referred to as an MTJ structure. In addition to the free layer 240, the tunnel barrier layer 250 and the pinned layer 270, the MTJ structure may further include one or more layers to improve a characteristic of the MTJ structure. In this implementation, the MTJ structure may further include the second middle layer 260 interposed between the tunnel barrier layer 250 and the pinned layer 270. Hereinafter, each layer will be described in more detail.

The substrate 200 may include a required structure (not shown), for example, a switching element which is coupled to a bottom end of the variable resistance element VR2 and supplies a required voltage or current to the variable resistance element VR2. The switching element may include a diode, or a transistor, etc.

The magnetic correction layer 220 may offset an influence of a stray magnetic field generated by the pinned layer 270. In this case, an influence of a stray magnetic field of the pinned layer 270 on the free layer 240 may be reduced so that a bias magnetic field generated in the free layer 240 is reduced. The magnetic correction layer 220 may have a magnetization direction which is anti-parallel to a magnetization direction of the pinned layer 270. In this implementation, magnetization directions of the free layer 240 and the pinned layer 270 may be substantially perpendicular to a surface of a layer, for example, the free layer 240 or the pinned layer 270. Therefore, the magnetic correction layer 220 may have a magnetization direction which is perpendicular to a surface of any layer. As shown in the drawings, when the pinned layer 270 has a downward magnetization direction, the magnetic correction layer 220 may have an upward magnetization direction. On the other hand, when the pinned layer 270 has an upward magnetization direction, the magnetic correction layer 220 may have a downward magnetization direction.

Also, the magnetic correction layer 220 may include a ferromagnetic material. For example, the magnetic correction layer 220 may include a ferromagnetic material which shows a high uniaxial magnetic anisotropy Hk equal to or greater than a certain threshold value, for example, 1 Tesla. For example, the magnetic correction layer 220 may include two or more elements A and B, e.g., an AB alloy or an AB stack structure as a composite structure including a layer formed of A and another layer formed of B. For example, 'A' may include Co, Fe or a combination thereof, and 'B' may include Pt, Pd, Ni or a combination of two or more of those and other elements.

The under layer 210 may be located under the magnetic correction layer 220 to serve as a buffer between the substrate 200 and the magnetic correction layer 220, and improve a characteristic of the magnetic correction layer 220. In one implementation, for example, the under layer 210 may include a metal oxide. The under layer 210 can be implemented as a single-layered structure, where the under layer 210 may be or include a metal oxide layer. The under layer 210 may be implemented as a multi-layered structure in which two or more layers are stacked. In such as multi-layered implementation, an uppermost layer of the under layer 210 may be or include a metal oxide layer, for example. casein implementations, the metal oxide of the under layer 210 may be redeposited along a sidewall of the variable resistance element VR2 during an etching process for forming the variable resistance element VR2 and the structure may be designed so that the redeposited metal oxide may not serve as a leakage path. This is because most of metal oxides are materials having a relatively low conductivity, for example, an insulating material or a semiconducting material. Since a current needs to flow through the variable resistance element VR2 to perform a switching operation of the variable resistance element VR2, the metal oxide layer of the under layer 210 may be formed to be sufficiently thin to allow a current flow through the variable resistance element VR2. For example, a thin metal oxide layer of the under layer 210 may have a thickness of 10 nm or less in some implementations.

Furthermore, when the magnetic correction layer 220 is formed of or includes a material having a high Hk such as a Co—Pt alloy, etc., the metal oxide of the under layer 210 may be or include ZnO. In this case, a perpendicular magnetic anisotropy of the magnetic correction layer 220 may be improved. It has been known that a perpendicular magnetic anisotropy of a high Hk material is improved when ZnO is in contact with the high Hk material under the high Hk material. When the under layer 210 includes ZnO, the under layer 210 may further include a noble metal layer located under the ZnO layer, for example, an Ag layer.

The free layer 240 may have a variable magnetization direction to store different data, and be referred to as a storage layer. The magnetization direction of the free layer 240 may be changed by spin transfer torque. In this implementation, the magnetization direction of the free layer 240 may be changed between a downward direction and an upward direction. The free layer 240 may have a single-layered structure or a multi-layered structure including a ferromagnetic material. Specially, the free layer 240 may include a CoFeB layer.

The first middle layer 230 may be located under the free layer 240 to serve as a buffer between the magnetic correction layer 220 and the free layer 240, and improve a characteristic of the free layer 240 and/or the magnetic correction layer 220. For example, when the free layer 240 includes the CoFeB layer, the first middle layer 230 may include a nonmagnetic metal layer which is in contact with the CoFeB layer of the free layer 240, for example, a Hf layer, a Zr layer, a Ti layer, a Ta layer, a Nb layer, a V layer, an Ir layer, a Cu layer, an Au layer, an Ag layer, or a Zn layer, etc. In this case, a high perpendicular magnetic crystalline anisotropy and a high dipolar magnetic anisotropy due to a high spin moment may be secured in the free layer 240. This is because that a perpendicular magnetic crystalline anisotropy and a dipolar magnetic anisotropy can be improved when a CoFeB layer is in contact with a nonmagnetic metal material.

Furthermore, in some implementations, the nonmagnetic metal layer of the first middle layer 230 may include the same metal that is included in the metal oxide of the under layer 210. In this case, since a process of forming the under layer 210 and a process of forming the first middle layer 230 use a same metal target, a cost of fabricating processes may be reduced. For example, when the under layer 210 includes a ZnO layer, the first middle layer 230 may include a Zn layer. Also, when the first middle layer 230 has a double-layered structure, an upper layer of the first middle layer 230 may be or include the nonmagnetic metal layer improving a characteristic of the free layer 240, and a lower layer of the first middle layer 230 may be or include a metal layer which is different from the upper layer and serves to improve a characteristic of the magnetic correction layer 220. For example, the upper layer of the first middle layer 230 may be or include a Zn layer, and the lower layer of the first middle layer 230 may be or include a Cu layer, an Ag layer or an Au layer.

The tunnel barrier layer 250 may include an insulating oxide, for example, MgO, CaO, SrO, TiO, VO, or NbO, etc. The tunnel barrier layer 250 may change the magnetization direction of the free layer 240 by tunneling of electrons during a writing operation.

The pinned layer 270 may have a pinned magnetization direction to be compared with the magnetization direction of the free layer 240, and be referred to as a reference layer, etc. The pinned layer 270 may have a single-layered structure or a multi-layered structure including a ferromagnetic material. For example, the pinned layer 270 may include an alloy of which a main component is Fe, Ni or Co, such as an Fe—Pt alloy, an Fe—Pd alloy, a Co—Pd alloy, a Co—Pt alloy, an Fe—Ni—Pt alloy, a Co—Fe—Pt alloy, or a Co—Ni—Pt alloy, etc. Alternately, for example, the pinned layer 270 may include a stack structure of Co/Pt or Co/Pd, etc.

The second middle layer 260 may serve as a buffer between the pinned layer 270 and the tunnel barrier layer 250, and improve characteristics of the pinned layer 270 and/or the tunnel barrier layer 250. The second middle layer 260 may have a single-layered structure or a multi-layered structure. For example, the second middle layer 260 may have a stack structure in which a ferromagnetic material such as CoFeB and a nonmagnetic metal material such as Ta are sequentially stacked.

The capping layer 280 may serve as a hard mask during a patterning process of the variable resistance element VR2, and include a conductive material such as a metal. Specially, the capping layer 280 may be formed of or include a metal-based material which has less pinholes and a great resistance to a wet etching and/or a dry etching. For example, the capping layer 280 may be formed of or include a noble metal such as Ru.

Meanwhile, although not shown, positions of the free layer 240 and the pinned layer 270 in the MTJ structure may be changed or reversed with each other. For example, the first middle layer 230 may be located under the free layer 240, and the second middle layer 260 may be located under the pinned layer 270. As a result, a structure can be provided, in which the under layer 210, the magnetic correction layer 220, the second middle layer 260, the pinned layer 270, the tunnel barrier layer 250, the first middle layer 230, the free layer 240 and the capping layer 280 are sequentially stacked.

When a certain voltage or current is applied to the variable resistance element VR2, the magnetization direction of the free layer 240 may be changed by transferring of a spin torque to be parallel to the magnetization direction of the pinned layer 270 or be anti-parallel to the magnetization direction of the pinned layer 270. Therefore, the variable resistance element VR2 may be switched between a low resistance state and a high resistance state, thereby storing different data. Accordingly, the variable resistance element VR2 may serve as a memory cell.

A method for fabricating the above variable resistance element VR2 will be briefly described as follows.

First, material layers for the under layer 210, the magnetic correction layer 220, the first middle layer 230, the free layer 240, the tunnel barrier layer 250, the second middle layer 260, the pinned layer 270 and the capping layer 280 may be sequentially deposited over the substrate 200. Here, when the under layer 210 includes the metal oxide, the under layer 210 may be formed by forming a metal layer using a depositing method, for example, a sputtering method using a corresponding metal target, and oxidizing the metal layer. When the first middle layer 230 includes a metal same as a metal included in the metal oxide of the under layer 210, the first middle layer 230 may be formed using the metal target which is used in the forming process of the under layer 210.

Then, the material layers may be selectively etched using a method having a strong physical etching characteristic, for example, an IBE (Ion Beam Etching) method. As the result, the variable resistance element VR2 of FIG. 2 is formed.

The above implementation may be used to achieve one or more following advantages.

First, since the magnetic correction layer 220 is located under the MTJ structure, an etching damage to a sidewall of the magnetic correction layer 220 may be reduced. Therefore, functions of the magnetic correction layer 220 can be secured.

Also, since the metal oxide of the under layer 210 serving as a buffer is located under the magnetic correction layer 220, a leakage path formed along a sidewall of the variable resistance element VR2 due to redeposition of the metal oxide may be blocked. Furthermore, a material for the under layer 210 can be selected in consideration of a material of the magnetic correction layer 220 in a manner that a characteristic such as a perpendicular magnetic anisotropy of the magnetic correction layer 220 is improved.

Also, since the first middle layer 230 which includes a nonmagnetic metal material and serves as a buffer is located under the free layer 240, characteristics of the free layer 240 such as a perpendicular magnetic crystalline anisotropy, a dipolar magnetic anisotropy and the like may be improved. In this case, a switching current of the variable resistance element VR2 may be reduced and a retention characteristic of the variable resistance element VR2 may be improved.

Furthermore, when the nonmagnetic metal material of the first middle layer 230 is same as the metal included in the metal oxide of the under layer 210, a same metal target may be used thereby reducing fabrication costs.

In the implementation of FIG. 2, all the materials for forming the variable resistance element VR2 are patterned using a single mask so as to have sidewalls aligned with one another. However, in other implementations, the under layer 210 of the variable resistance element VR2 may be patterned separately from remaining layers of the variable resistance element VR2. This will be exemplarily described with reference to FIG. 3 in the below.

Figure 3:
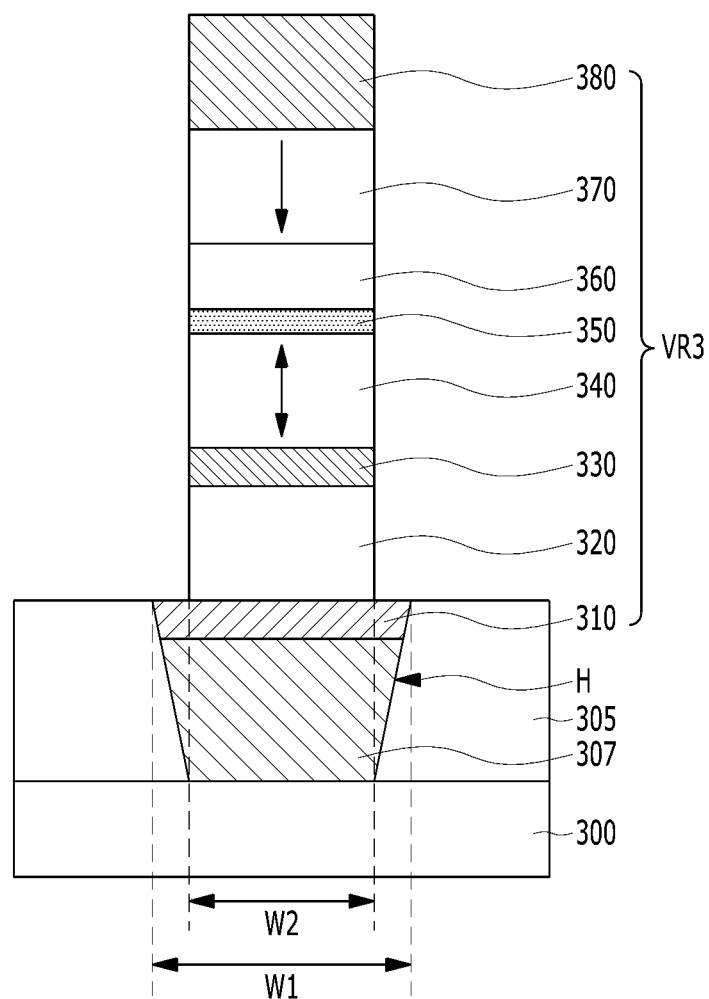
FIG. 3 is a cross-sectional view illustrating an exemplary variable resistance element in accordance with another implementation of the present disclosure.

FIG. 3 is a cross-sectional view illustrating an exemplary variable resistance element in accordance with another implementation of the present disclosure. Differences from FIG. 2 will be mainly described.

Referring to FIG. 3, a variable resistance element VR3 of this implementation may include a substrate structure and a stack structure. The substrate structure includes a substrate 300, an interlayer dielectric layer 305 and a conductive contact 307, an under layer 310 included or filled in the substrate structure. The stack structure includes a magnetic correction layer 320, a first middle layer 330, a free layer 340, a tunnel barrier layer 350, a second middle layer 360, a pinned layer 370 and a capping layer 380 that are sequentially stacked over the under layer 310.

The under layer 310, the magnetic correction layer 320, the first middle layer 330, the free layer 340, the tunnel barrier layer 350, the second middle layer 360, the pinned layer 370 and the capping layer 380 may be formed of or include same materials as the under layer 210, the magnetic correction layer 220, the first middle layer 230, the free layer 240, the tunnel barrier layer 250, the second middle layer 260, the pinned layer 270 and the capping layer 280 of FIG. 2, respectively.

The variable resistance element VR3 may be fabricated by following processes.

First, the interlayer dielectric layer 305 may be formed over the substrate 300 in which a required element (now shown) such as a switching element is formed, and then, a hole H may be formed in the interlayer dielectric layer 305 by selectively etching the interlayer dielectric layer 305. The hole H may expose a portion of the substrate 300, for example, an end of the switching element.

Then, a conductive material is formed over a resultant structure including the hole H and an etch back process is performed on the conductive material to provide the conductive contact 307 formed or filled in a lower portion of the hole H. The etch back process may be performed until the conductive material has a required height.

Then, the under layer 310 may be formed in a remaining space of the hole H including the conductive contact 307. Specifically, the under layer 310 may be formed by forming a material, for example, a metal oxide, for forming the under layer 310 over the hole H including the conductive contact 307, and performing a planarization process, for example, a CMP (Chemical Mechanical Polishing) process until a top surface of the interlayer dielectric layer 305 is exposed.

Then, the variable resistance element VR3 shown in FIG. 3 may be formed by sequentially forming, over the under layer 310 and the interlayer dielectric layer 305, material layers that are used to form the magnetic correction layer 320, the first middle layer 330, the free layer 340, the tunnel barrier layer 350, the second middle layer 360, the pinned layer 370 and the capping layer 380 and selectively etching the material layers.

By this implantation, the under layer 310 may have a sidewall aligned with a sidewall of the conductive contact 307, and the remaining layers of the variable resistance element VR3 may have sidewalls aligned with one another while not being aligned with the sidewall of the under layer 310. Since the under layer 310 is formed or filled in the substrate structure, an etching height for forming the variable resistance element VR3 may be reduced compared to the implementation of FIG. 2. As a result, an etching process may be facilitated.

Furthermore, a width W1 of a top surface of the under layer 310 may be greater than a width W2 of a bottom surface of the remaining portion of the variable resistance element VR3 including the remaining layers except the under layer 310. The remaining layers of the variable resistance element VR3 may be located over the under layer 310. In this case, the remaining layers of the variable resistance element VR3, specially the tunnel barrier layer 350, may be located over a top surface of the under layer 310 that has been planarized to be at the same height with that of the interlayer dielectric layer 310, thereby preventing a deterioration of characteristics of the variable resistance element VR3. If the tunnel barrier layer 350 is located over a boundary between the interlayer dielectric layer 305 and the under layer 310 to be bent, the characteristics of the variable resistance element VR3 may be deteriorated.

When the width W1 of the under layer 310 is large as described above, a portion of the top surface of the under layer 310 may be exposed after etching the remaining layers of the variable resistance element VR3 so that a material of the under layer 310 is attached to the sidewall of the variable resistance element VR3. However, when the under layer 310 is formed of or includes a metal oxide which has a low conductivity, the metal oxide attached to the sidewall of the variable resistance element VR3 does not serve as a leakage path.

The above and other memory circuits or semiconductor devices based on the disclosed technology can be used in a range of devices or systems. FIGS. 4-8 provide some examples of devices or systems that can implement the memory circuits disclosed herein.

Figure 4:
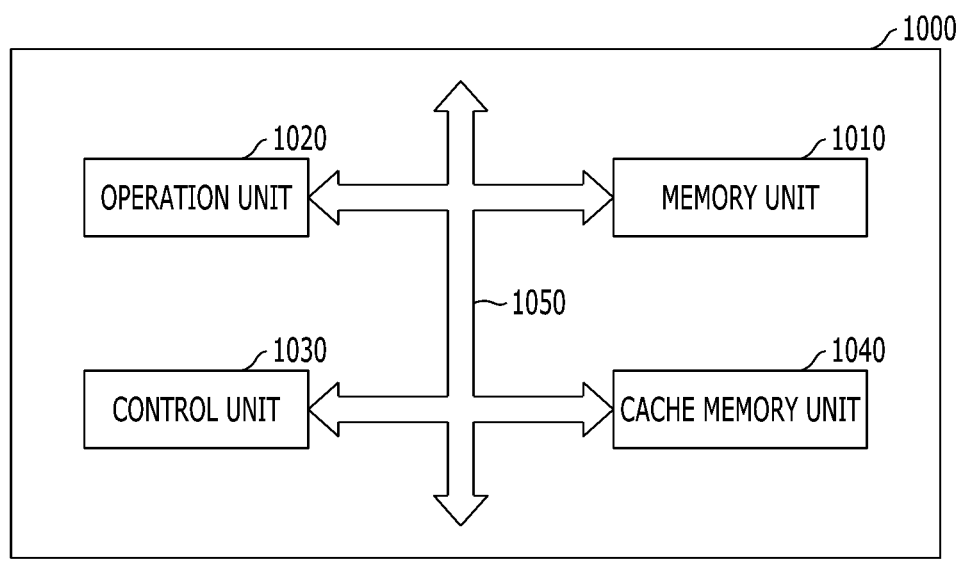
FIG. 4 is an example of configuration diagram of a microprocessor implementing memory circuitry based on the disclosed technology.

FIG. 4 is an example of configuration diagram of a microprocessor implementing memory circuitry based on the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
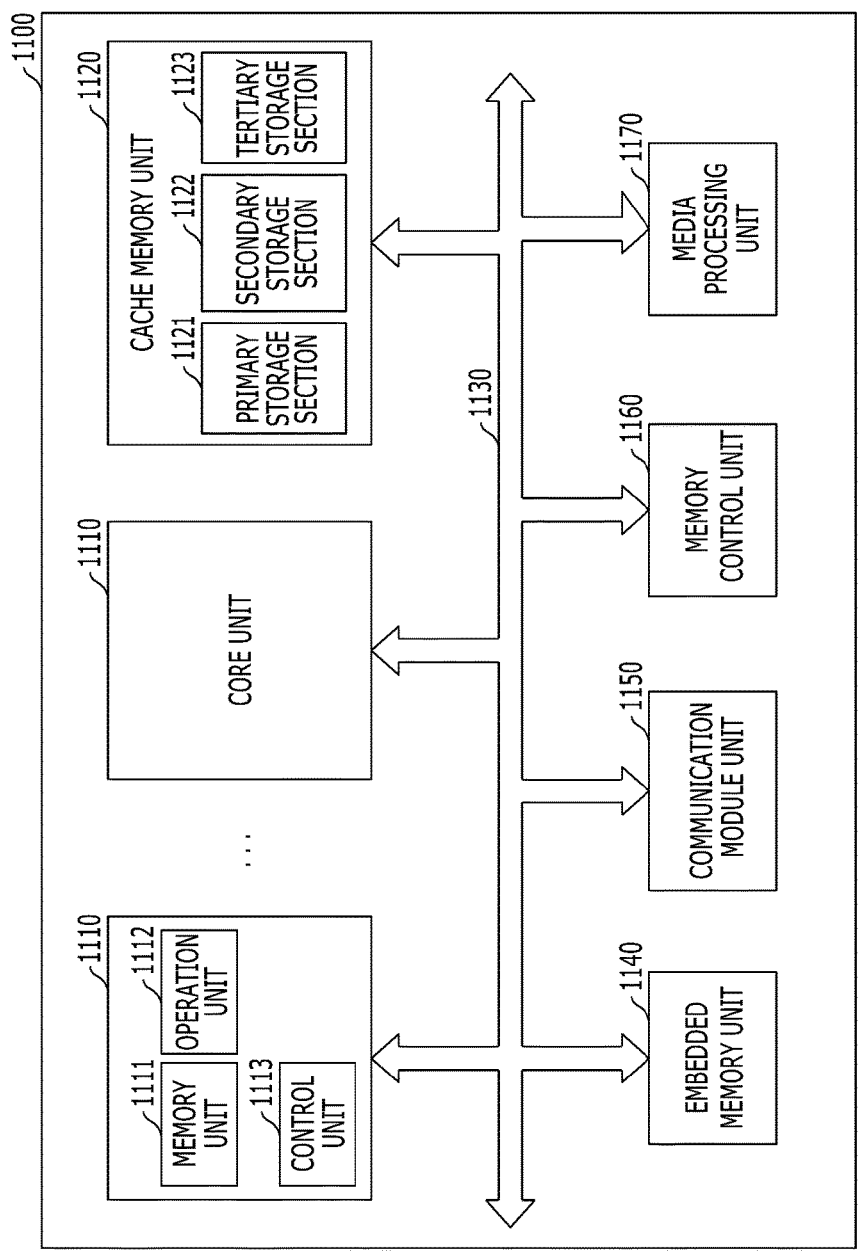
FIG. 5 is an example of configuration diagram of a processor implementing memory circuitry based on the disclosed technology.

FIG. 5 is an example of configuration diagram of a processor implementing memory circuitry based on the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the cache memory unit 1120 may be improved. As a consequence, operating characteristics of the processor 1100 may be improved.

Figure 6:
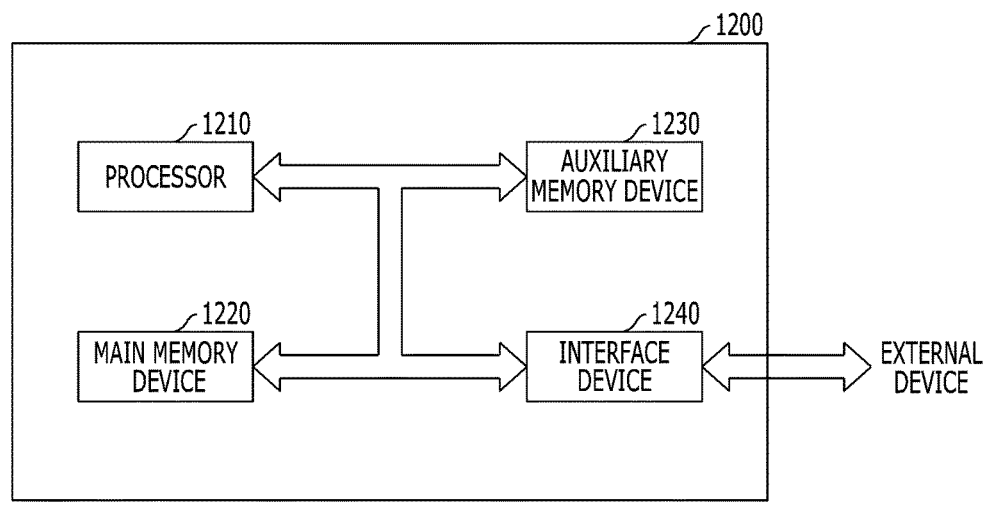
FIG. 6 is an example of configuration diagram of a system implementing memory circuitry based on the disclosed technology.

Although it was shown in FIG. 6 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

FIG. 6 is an example of configuration diagram of a system implementing memory circuitry based on the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
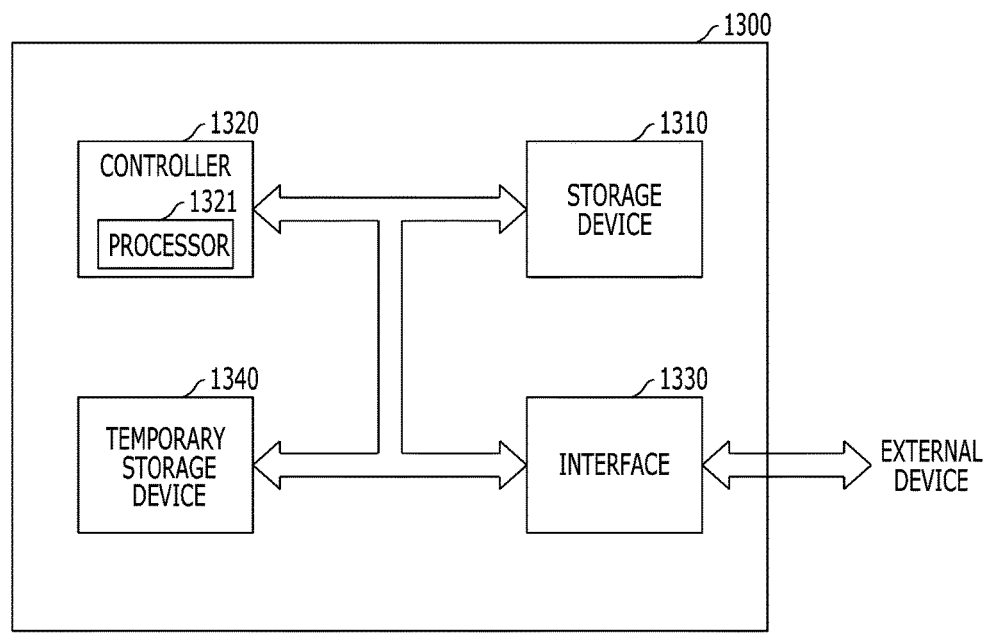
FIG. 7 is an example of configuration diagram of a data storage system implementing memory circuitry based on the disclosed technology.

FIG. 7 is an example of configuration diagram of a data storage system implementing memory circuitry based on the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the storage device 1310 or the temporary storage device 1340 may be improved. As a consequence, operating characteristics and data storage characteristics of the data storage system 1300 may be improved.

Figure 8:
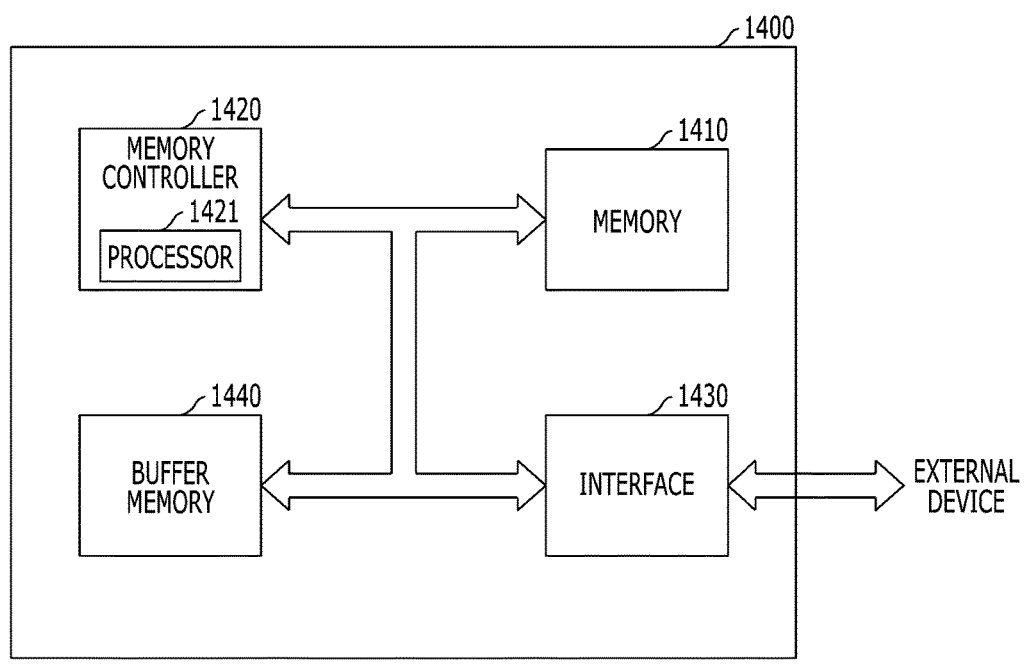
FIG. 8 is an example of configuration diagram of a memory system implementing memory circuitry based on the disclosed technology.

FIG. 8 is an example of configuration diagram of a memory system implementing memory circuitry based on the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a Magnetic Tunnel Junction (MTJ) structure including a free layer having a variable magnetization direction, a pinned layer having a pinned magnetization direction, and a tunnel barrier layer interposed between the pinned layer and the free layer; a magnetic correction layer located under the MTJ structure and operates to reduce an influence of a stray magnetic field generated by the pinned layer; and an under layer located under the magnetic correction layer and including a metal oxide layer. Through this, data storage characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory includes:
    a Magnetic Tunnel Junction (MTJ) structure including a free layer having a variable magnetization direction, a pinned layer having a pinned magnetization direction, and a tunnel barrier layer interposed between the pinned layer and the free layer, wherein the free layer is located at an undermost portion of the MTJ structure;
    a magnetic correction layer located under the MTJ structure and operates to reduce an influence of a stray magnetic field generated by the pinned layer;
    an under layer located under the magnetic correction layer and including a metal oxide layer; and
    a middle layer located between the free layer and the magnetic correction layer, and including a nonmagnetic metal layer, and
    wherein the nonmagnetic metal layer includes Zn, and the metal oxide layer includes ZnO.

2. The electronic device of claim 1, wherein the metal oxide layer has a thickness which allows a current flow and has an insulating characteristic or a semiconducting characteristic.

3. The electronic device of claim 2, wherein the metal oxide layer has a thickness less than about 10 nm.

4. The electronic device of claim 1, wherein the magnetic correction layer includes different elements that include Co or Fe in a combination with Pt, Pd, or Ni.

5. The electronic device of claim 1, wherein the MTJ structure, the magnetic correction layer and the under layer have sidewalls aligned with each other.

6. The electronic device of claim 1, wherein the MTJ structure and the magnetic correction layer have sidewalls aligned with each other, and
    the under layer has a sidewall which is not aligned with the sidewalls of the MTJ structure and the magnetic correction layer.

7. The electronic device of claim 6, wherein a width of a top surface of the under layer is larger than a width of a bottom surface of the magnetic correction layer.

8. The electronic device of claim 1, wherein the free layer includes CoFeB.

9. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

10. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

11. The electronic device according to claim 1, further comprising a data storage system which includes:
    a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

12. The electronic device according to claim 1, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

13. An electronic device comprising a semiconductor memory, wherein the semiconductor memory includes:

a metal oxide under layer;

a magnetic correction layer located over the metal oxide under layer;

a nonmagnetic metal middle layer located over the magnetic correction layer;

a free layer including CoFeB and located over the nonmagnetic metal middle layer;

a tunnel barrier layer located over the free layer; and a pinned layer located over the tunnel barrier layer, wherein the nonmagnetic metal middle layer includes Zn, and the metal oxide under layer includes ZnO.

14. The electronic device of claim 13, wherein the magnetic correction layer includes Co or Fe in a combination with Pt, Pd, or Ni, and the metal oxide under layer includes ZnO.

* * * * *